(12) United States Patent
Yasuda

(10) Patent No.: US 9,953,996 B2
(45) Date of Patent: Apr. 24, 2018

(54) SEMICONDUCTOR MEMORY DEVICE

(71) Applicant: Toshiba Memory Corporation, Minato-ku (JP)

(72) Inventor: Naoki Yasuda, Mie (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/219,738

(22) Filed: Jul. 26, 2016

(65) Prior Publication Data

US 2017/0229475 A1   Aug. 10, 2017

Related U.S. Application Data

(60) Provisional application No. 62/293,356, filed on Feb. 10, 2016.

(51) Int. Cl.

| | |
|---|---|
| *H01L 29/66* | (2006.01) |
| *H01L 27/11582* | (2017.01) |
| *H01L 21/3065* | (2006.01) |
| *H01L 21/02* | (2006.01) |
| *H01L 49/02* | (2006.01) |

(52) U.S. Cl.
CPC .... *H01L 27/11582* (2013.01); *H01L 21/0217* (2013.01); *H01L 21/02164* (2013.01); *H01L 21/02271* (2013.01); *H01L 21/3065* (2013.01); *H01L 28/00* (2013.01)

(58) Field of Classification Search
CPC .......... H01L 21/02; H01L 27/11; H01L 29/66
USPC ............................................... 257/320–326
See application file for complete search history.

(56) References Cited

U.S. PATENT DOCUMENTS

| | | |
|---|---|---|
| 8,115,249 B2 | 2/2012 | Kamioka et al. |
| 8,710,581 B2 | 4/2014 | Komiya |
| 8,759,897 B2 | 6/2014 | Oota et al. |

(Continued)

FOREIGN PATENT DOCUMENTS

| | | |
|---|---|---|
| JP | 2010-140996 | 6/2010 |
| JP | 2011-009409 | 1/2011 |
| JP | 2011-14638 | 1/2011 |

OTHER PUBLICATIONS

Jaehoon Jang, et al., "Vertical Cell Array using TCAT (Terabit Cell Array Transistor) Technology for Ultra High Density NAND Flash Memory", Symposium on VLSI Technology Digest of Technical Papers, 2009, 2 pgs.

*Primary Examiner* — Marvin Payen
(74) *Attorney, Agent, or Firm* — Oblon, McClelland, Maier & Neustadt, L.L.P.

(57) ABSTRACT

According to one embodiment, a semiconductor memory device includes a substrate, a stacked body, a semiconductor pillar, and a charge storage film. The stacked body is provided on the substrate. The stacked body includes a plurality of first insulating films and a plurality of electrode films alternately stacked one layer by one layer. The semiconductor pillar is provided inside the stacked body and extends in a stacking direction of the stacked body. The charge storage film is provided between the semiconductor pillar and each of the electrode films. The plurality of first insulating films include a first portion surrounding the semiconductor pillar and a second portion provided between the first portion and the semiconductor pillar, the second portion having a dielectric constant higher than a dielectric constant of the first portion.

20 Claims, 14 Drawing Sheets

(56) References Cited

U.S. PATENT DOCUMENTS

2010/0237402 A1* 9/2010 Sekine .............. H01L 27/11551
257/324
2014/0203344 A1* 7/2014 Hopkins ........... H01L 29/42324
257/316

* cited by examiner

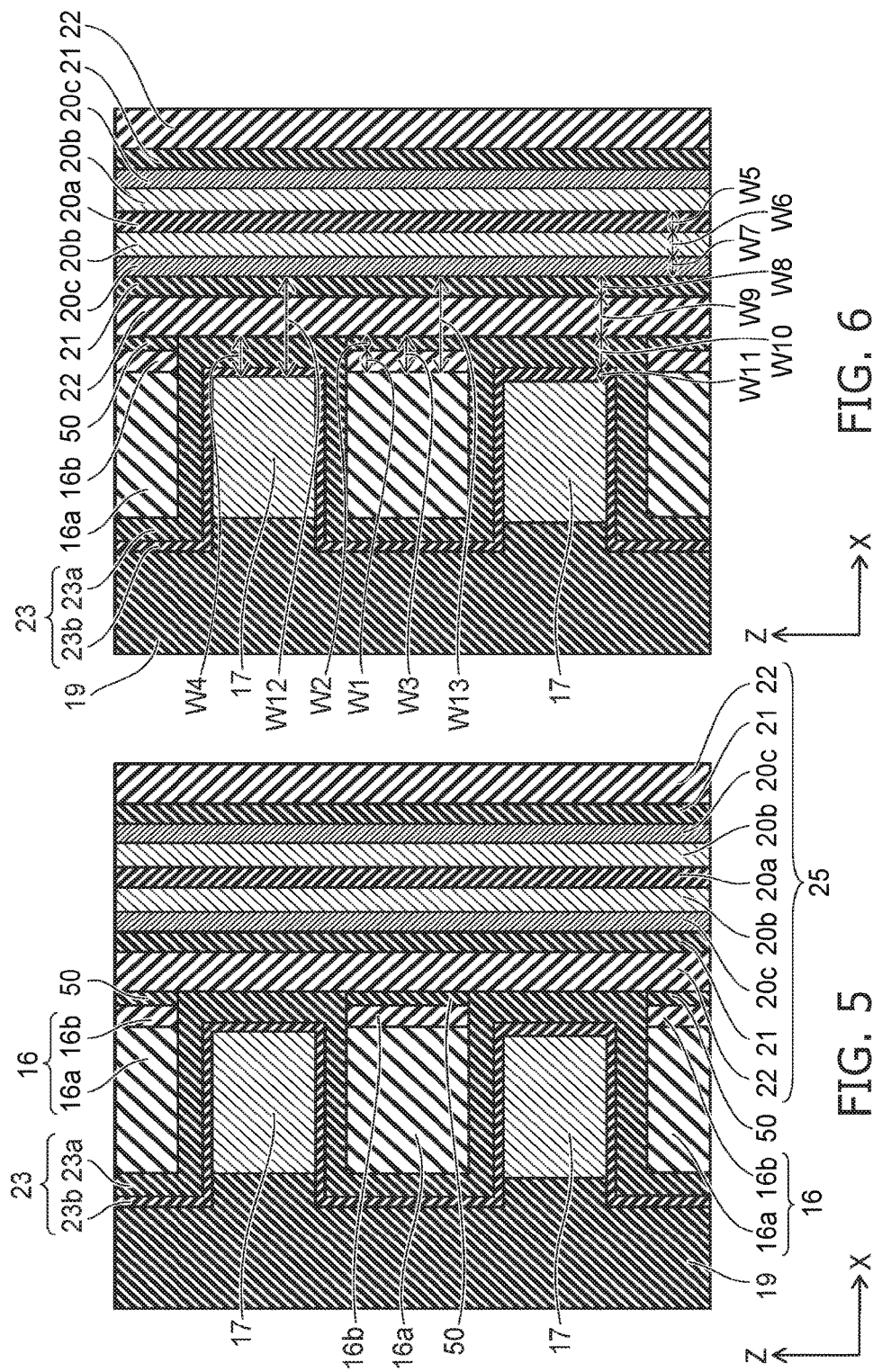

US 9,953,996 B2

SEMICONDUCTOR MEMORY DEVICE

CROSS-REFERENCE TO RELATED APPLICATIONS

This application is based upon and claims the benefit of priority from U.S. Provisional Patent Application 62/293,356, filed on Feb. 10, 2016; the entire contents of which are incorporated herein by reference.

FIELD

Embodiments described herein relate generally to a semiconductor memory device.

BACKGROUND

A semiconductor memory device having a three-dimensional structure has been proposed in which memory holes are made in a stacked body in which electrode films are multiply stacked with insulating films interposed, and a silicon body used to form a channel is provided with a charge storage film interposed inside each memory hole. The columnar body that includes the charge storage film and the silicon body pierces each of the insulating films and each of the electrode films; and a memory cell that includes the charge storage film is formed at each intersection between the silicon bodies and the electrode films. The electrode film functions as a control gate of the memory cell.

In such a semiconductor memory device, the insulating film that is positioned between the electrode films opposes a portion of the silicon body connecting the memory cells in series. There is a risk that the channel resistance of the silicon body opposing the insulating film may become higher than the channel resistance of the silicon body opposing the electrode film. Thereby, there is a risk that the current may no longer flow easily in the silicon body; and problems may occur in the memory operations.

BRIEF DESCRIPTION OF THE DRAWINGS

FIG. 5 and FIG. 6 are enlarged cross-sectional views showing a portion of the semiconductor memory device according to the first embodiment;

FIG. 7A and FIG. 7B to FIG. 11A and FIG. 11B are cross-sectional views showing a method for manufacturing the semiconductor memory device according to the first embodiment;

DETAILED DESCRIPTION

Figure 1:
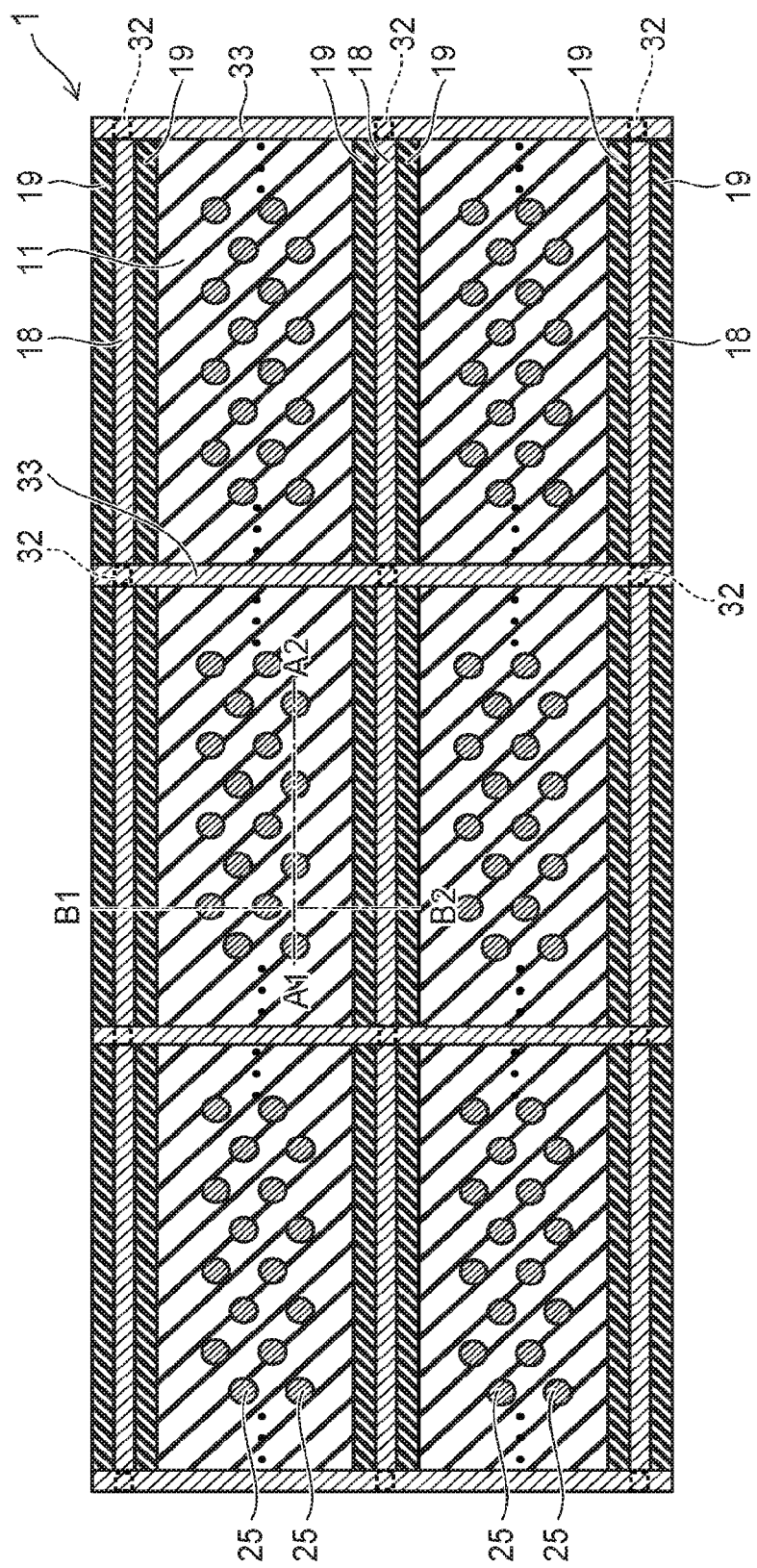
FIG. 1 is a plan view showing a semiconductor memory device according to a first embodiment.

According to one embodiment, a semiconductor memory device includes a substrate, a stacked body, a semiconductor pillar, and a charge storage film. The stacked body is provided on the substrate. The stacked body includes a plurality of first insulating films and a plurality of electrode films alternately stacked one layer by one layer. The semiconductor pillar is provided inside the stacked body and extends in a stacking direction of the stacked body. The charge storage film is provided between the semiconductor pillar and each of the electrode films. The plurality of first insulating films include a first portion surrounding the semiconductor pillar and a second portion provided between the first portion and the semiconductor pillar, the second portion having a dielectric constant higher than a dielectric constant of the first portion.

Various embodiments will be described hereinafter with reference to the accompanying drawings. In the respective drawings, the same concepts are labeled with like reference numerals. All of drawings shown in the following are schematic. For example, for convenience to see the drawings, in some drawings, some constituent features are omitted or the number of the constituent features is reduced for drawing. The number and dimension ratio of the respective constituent features are not always consistent among drawings.

(First Embodiment)

Figure 2:
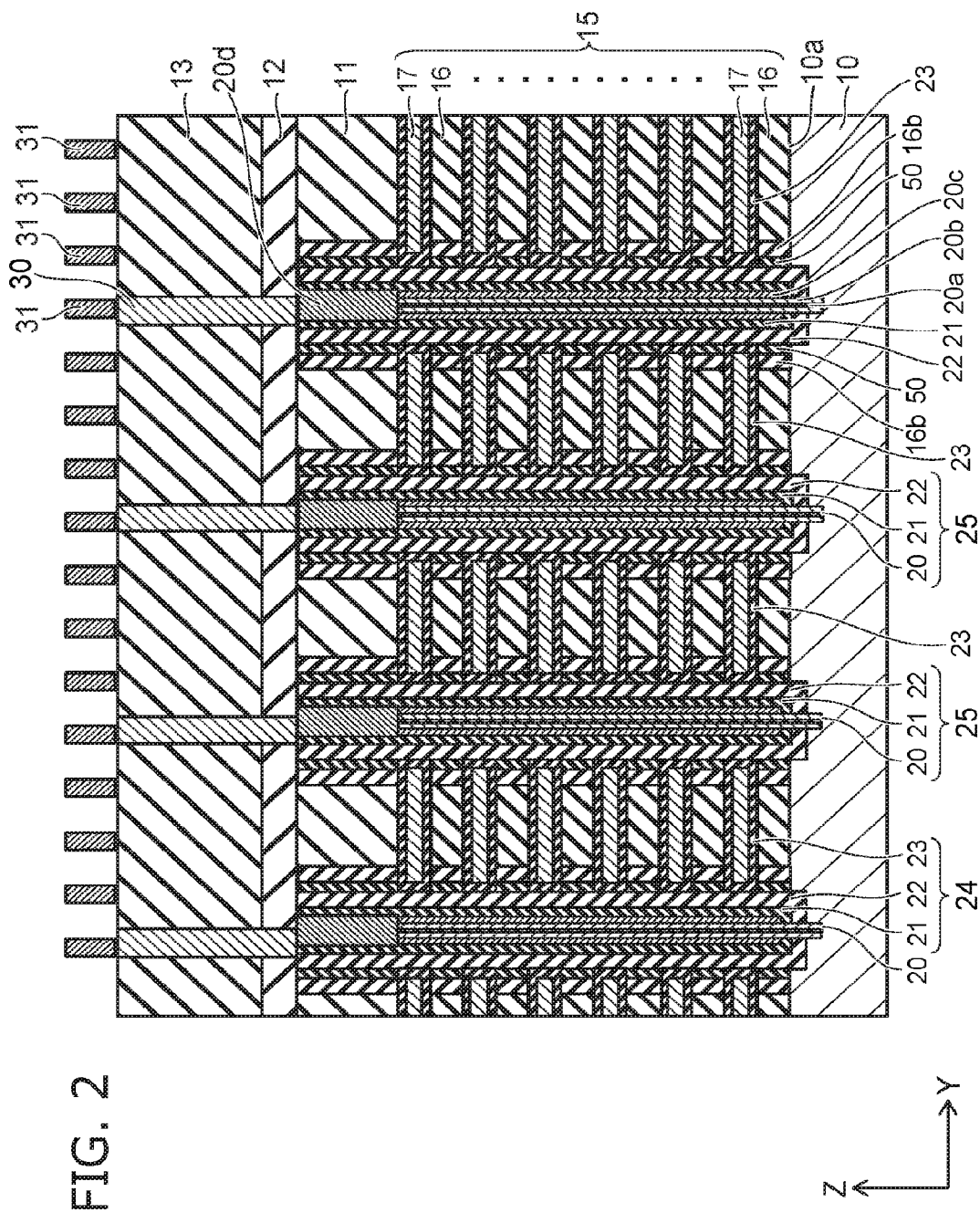
FIG. 2 and FIG. 3 are cross-sectional views showing the semiconductor memory device according to the first embodiment.
Figure 3:
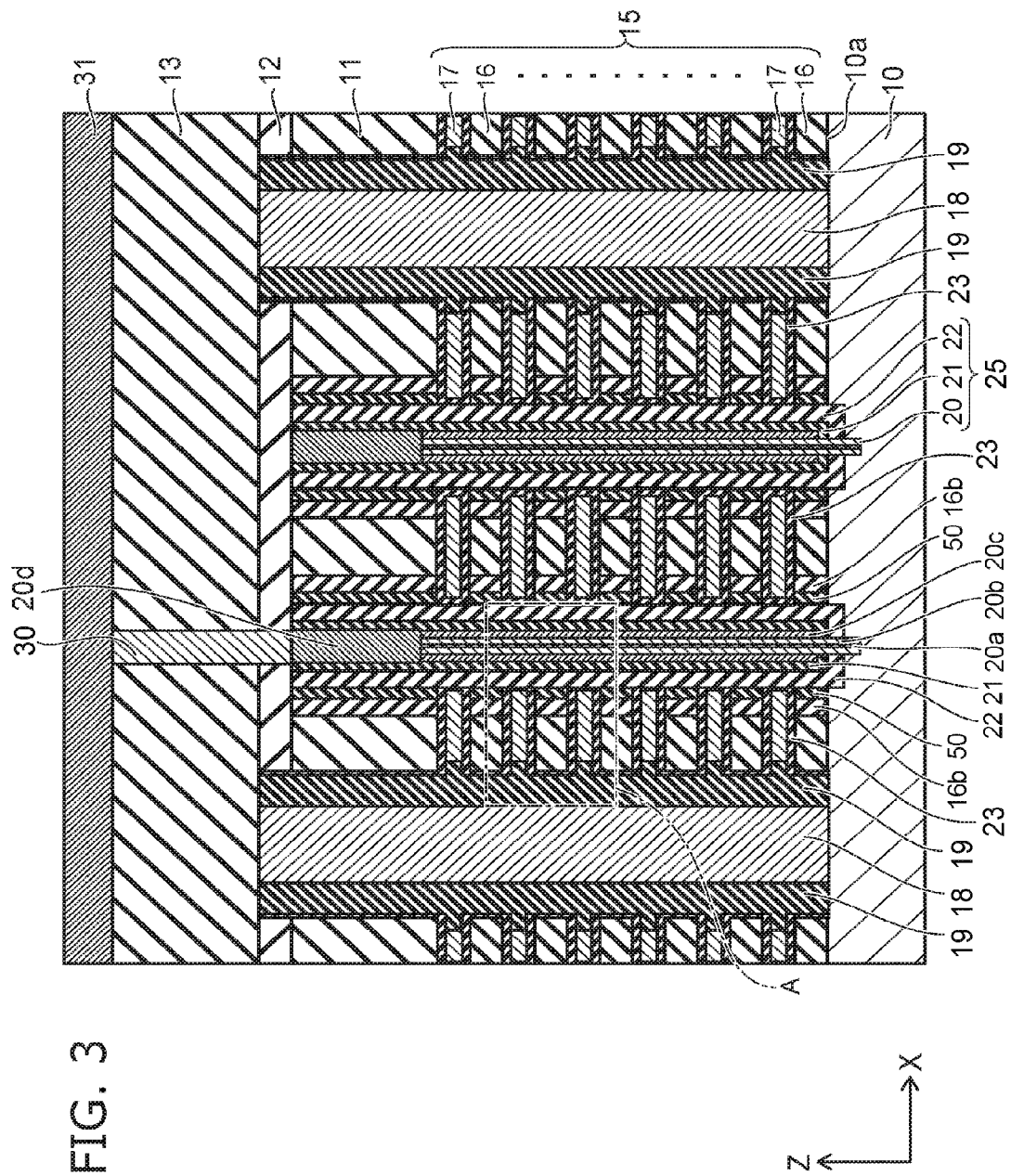

FIG. 1 shows an X-Y plan view of a semiconductor memory device 1 according to a first embodiment. FIG. 2 and FIG. 3 respectively show cross-sectional views along line A1-A2 and line B1-B2 of FIG. 1. An insulating film 12, an insulating film 13, contact units 30, and bit lines 31 are not shown in FIG. 1.

A substrate 10 such as a silicon substrate or the like is provided in the semiconductor memory device 1 according to the embodiment. Hereinbelow, in the description of the specification, an XYZ orthogonal coordinate system is used for convenience of description. Two mutually-orthogonal directions parallel to an upper surface 10a of the substrate 10 are taken as an "X-direction" and a "Y-direction;" and a direction perpendicular to the upper surface 10a of the substrate 10 is taken as a "Z-direction."

As shown in FIG. 2 and FIG. 3, a stacked body 15 is provided on the substrate 10.

Multiple insulating films 16 and multiple electrode films 17 are alternately stacked in the Z-direction one layer by one layer in the stacked body 15. The electrode film 17 includes, for example, a metal such as tungsten (W), etc. The electrode film 17 may include a main body portion formed of a metal material and a peripheral portion such as a barrier metal layer, etc., covering the surface of the main body portion. The insulating film 16 is described below in detail.

An insulating film 11 is provided on the stacked body 15. The insulating film 12 is provided on the insulating film 11; and the insulating film 13 is provided on the insulating film 12. The insulating film 11, the insulating film 12, and the insulating film 13 include, for example, silicon oxide ($SiO_2$).

Multiple columnar units 25 that extend in the Z-direction and pierce the stacked body 15 and the insulating film 11 are provided inside the stacked body 15 and the insulating film 11. The configuration of each of the columnar units 25 is, for example, a circular column. Each of the columnar units 25 includes a silicon pillar 20, a tunneling insulating film 21, and a charge storage film 22.

The silicon pillar 20 extends in the Z-direction. The silicon pillar 20 pierces the insulating film 11 and the stacked body 15; and the lower end of the silicon pillar 20 contacts the substrate 10. An insulating core unit 20a, a silicon body unit 20b, a cover silicon layer 20c, and a plug unit 20d are provided in the silicon pillar 20. The insulating core unit 20a includes, for example, silicon oxide. The configuration of the insulating core unit 20a is, for example, a circular column. The insulating core unit 20a is disposed inside the stacked body 15 and is not disposed inside the insulating film 11. The insulating core unit 20a may not be provided in the silicon pillar 20.

The silicon body unit 20b is provided around the insulating core unit 20a, that is, on the side surface. The silicon body unit 20b includes, for example, silicon. The silicon is, for example, polysilicon made of amorphous silicon that is crystallized. The configuration of the silicon body unit 20b is, for example, a circular tube.

The cover silicon layer 20c is provided around the silicon body unit 20b. The cover silicon layer 20c includes, for example, silicon. The silicon is, for example, polysilicon made of amorphous silicon that is crystallized. The configuration of the cover silicon layer 20c is, for example, a circular tube.

The plug unit 20d is provided above the insulating core unit 20a, the silicon body unit 20b, and the cover silicon layer 20c and is provided to be positioned inside the insulating film 11. The plug unit 20d includes, for example, silicon. The silicon is, for example, polysilicon made of amorphous silicon that is crystallized.

The tunneling insulating film 21 is provided around the silicon pillar 20. The tunneling insulating film 21 is, for example, a single-layer silicon oxide film, or an ONO film in which the silicon oxide film, the silicon nitride film, and the silicon oxide film are stacked.

The charge storage film 22 is provided around the tunneling insulating film 21. The charge storage film 22 is a film for storing charge and is formed of, for example, a material having trap sites of electrons and holes. The charge storage film 22 includes, for example, silicon nitride ($Si_3N_4$).

Tunneling of the charge occurs in the tunneling insulating film 21 when the electrons move from the silicon pillar 20 into the charge storage film 22 (e.g., a programming operation) and when the electrons move from the charge storage film 22 into the silicon pillar 20 or when the holes move from the silicon pillar 20 into the charge storage film 22 (e.g., an erasing operation). Also, a memory cell that includes the charge storage film 22 is formed at each intersection between the silicon body unit 20b and the electrode film 17. The threshold voltage of the memory cell changes due to the existence/absence of the charge trapped in the trap sites and the amount of the trapped charge. Thereby, the memory cell stores information.

A blocking insulating film 23 is provided on the outer side of the columnar unit 25. The blocking insulating film 23 is disposed between the electrode film 17 and the charge storage film 22, between the insulating film 16 and the electrode film 17, and between the insulating film 16 and an insulating film 19. The blocking insulating film 23 is, for example, a single-layer silicon oxide film, or a stacked film in which a silicon oxide film and an aluminum oxide film made of aluminum oxide ($Al_2O_3$) are stacked. A memory film 24 that can store charge includes the tunneling insulating film 21, the charge storage film 22, and the blocking insulating film 23.

The contact units 30 that extend in the Z-direction and pierce the insulating film 12 and the insulating film 13 are provided in the regions directly above the silicon pillars 20. For example, the contact units 30 are formed of a metal material such as tungsten, etc. The bit lines 31 that extend in the X-direction are multiply provided on the insulating film 13. Each of the bit lines 31 is connected via one contact unit 30 to one silicon pillar 20 every stacked body 15.

As shown in FIG. 1 and FIG. 3, interconnect units 18 are multiply provided on the substrate 10. The multiple interconnect units 18 are separated from each other along the X-direction, are arranged at uniform spacing, and extend in the Y-direction. The insulating film 12, the insulating film 11, and the stacked body 15 are partitioned by the interconnect units 18 and extend in the Y-direction. Accordingly, the insulating films 16 and the electrode films 17 also extend in the Y-direction. For example, the interconnect units 18 are formed of a metal material such as tungsten, etc.

The insulating film 19 is provided between the interconnect unit 18 and the structure body made of the stacked body 15, the insulating film 11, and the insulating film 12. The electrode films 17 are insulated from the interconnect unit 18 by the insulating film 19. The insulating film 19 also extends in the Y-direction. The insulating film 19 includes, for example, silicon oxide.

As shown in FIG. 1, source lines 33 that extend in the X-direction are multiply provided above the interconnect units 18. The source lines 33 are connected to the interconnect units 18 via contact units 32. For example, the contact units 32 are formed of a metal material such as tungsten, etc. In the Z-direction, the source lines 33 are positioned in the same layer as the bit lines 31 or in a layer lower than the bit lines 31.

The electrode films 17 inside the stacked body 15 are divided into multiple blocks extending in the Y-direction and arranged along the X-direction; and word lines as control gates are formed in each block. Each block corresponds to the portion between the mutually-adjacent interconnect units 18; and, for example, in each block, columns of the multiple columnar units 25 arranged in a staggered configuration in the Y-direction are arranged in four columns.

Each of the bit lines 31 extends in the X-direction over multiple blocks and is connected to one columnar unit 25 (silicon pillar 20) every block. As described above, a memory cell that includes the charge storage film 22 is formed at each intersection between the electrode films 17 and the silicon body units 20b of the silicon pillars 20. Such memory cells are numerously arranged in a three-dimensional matrix configuration along the X-direction, the Y-direction, and the Z-direction; and data can be stored in each memory cell.

The insulating film 16 will now be described.

Figure 4:
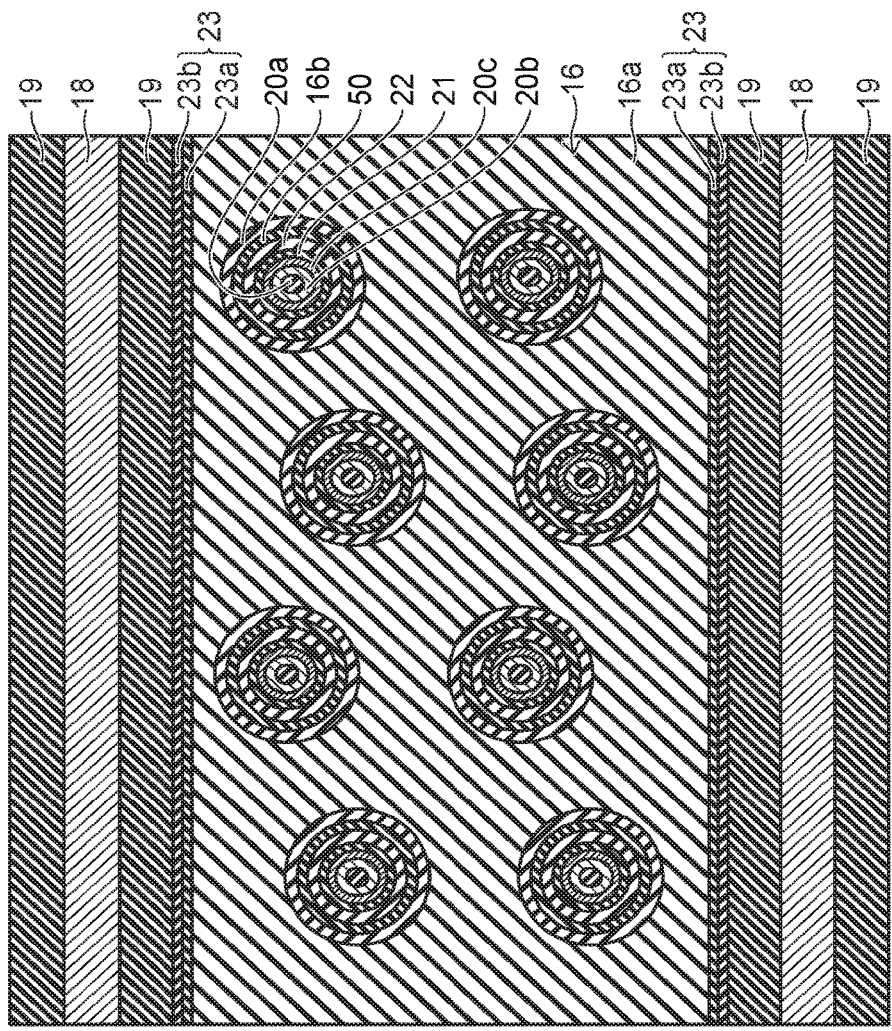
FIG. 4 is an enlarged plan view showing a portion of the semiconductor memory device according to the first embodiment.

FIG. 4 is an enlarged plan view of the insulating film 16. FIG. 5 shows an enlarged view of region A of FIG. 3. FIG. 6 is a drawing showing the same enlarged portion as FIG. 5.

As shown in FIG. 4 and FIG. 5, the multiple columnar units 25 pierce the insulating film 16 extending in the Y-direction. An insulating portion 16a and a nitrided portion 16b are provided in the insulating film 16. The insulating portion 16a is provided at the side of the columnar unit 25. For example, the insulating portion 16a contacts the nitrided portion 16b. Also, the insulating portion 16a is positioned between the blocking insulating film 23 including a silicon oxide film 23a and an aluminum oxide film 23b. The insulating portion 16a includes, for example, silicon oxide.

The silicon oxide film 23a and the aluminum oxide film 23b are stacked in order between the electrode film 17 and the charge storage film 22, between the insulating film 16 and the electrode film 17, and between the insulating film 16 and the insulating film 19. In FIG. 2 and FIG. 3, the silicon oxide film 23a and the aluminum oxide film 23b of the blocking insulating film 23 are not shown.

The nitrided portion 16b is provided to be positioned on the columnar unit 25 side compared to the insulating portion 16a. The configuration of the nitrided portion 16b is, for example, a cylindrical configuration. The insulating portion 16a is provided around the nitrided portion 16b, that is, the insulating portion 16a surrounds the side surface of the nitrided portion 16b. For example, the nitrided portion 16b contacts a protective film 50.

The nitrided portion 16b includes a material that is different from the insulating portion 16a and has a dielectric constant higher than that of the material of which the insulating portion 16a is formed. In the case where the insulating portion 16a includes silicon oxide, the nitrided portion 16b includes a material having a dielectric constant higher than that of silicon oxide, e.g., silicon oxynitride (SiON). In the case where the insulating portion 16a and the nitrided portion 16b respectively include silicon oxide and silicon oxynitride, for example, the nitrided portion 16b is formed by forming a silicon oxynitride film by performing plasma nitridation of the surface of a silicon oxide film.

The nitrided portion 16b is not limited to the material described above and can include an insulating material that is different from the insulating portion 16a and has a dielectric constant higher than that of the insulating portion 16a.

The protective film 50 is provided between the nitrided portion 16b and the columnar unit 25 (the charge storage film 22). The configuration of the protective film 50 is, for example, a cylindrical configuration. The protective film 50 is positioned between the blocking insulating film 23 so that the protective film 50 is provided around the columnar unit 25. The protective film 50 includes, for example, silicon oxide. The protective film 50 may not be provided between the nitrided portion 16b and the columnar unit 25.

As shown in FIG. 6, for example, a thickness W1 of the nitrided portion 16b and a thickness W2 of the protective film 50 are thinner than a thickness W4 of the blocking insulating film 23 positioned between the electrode film 17 and the charge storage film 22. For example, a total thickness W3 (W1+W2) of the nitrided portion 16b and the protective film 50 is thinner than the thickness W4 of the blocking insulating film 23. In such a case, the nitrided portion 16b and the protective film 50 do not overlap the electrode film 17 as viewed from the Z-direction. Also, the nitrided portion 16b and the protective film 50 are positioned to be interposed between the portions of the blocking insulating film 23 that have the thickness W4 and are provided in contact with two electrode films 17 in the Z-direction.

For example, in the case where the diameter of the memory hole is 120 nanometers, the thickness W1 and the thickness W2 are 2 nanometers. Also, a thickness W5 of the insulating core unit 20a, a thickness W6 of the silicon body unit 20b, and a thickness W7 of the cover silicon layer 20c respectively are 10 nanometers, 10 nanometers, and 5 nanometers. A thickness W8 of the tunneling insulating film 21, a thickness W9 of the charge storage film 22, a thickness W10 of the silicon oxide film 23a, and a thickness W11 of the aluminum oxide film 23b respectively are 5 nanometers, 3 nanometers, 6 nanometers, and 3 nanometers.

A total thickness W12 of the tunneling insulating film 21, the charge storage film 22, and the blocking insulating film 23 (the thickness of the memory film 24) is 17 nanometers. On the other hand, a total thickness W13 of the tunneling insulating film 21, the charge storage film 22, the protective film 50, and the nitrided portion 16b is 12 nanometers. In the case where the thickness W13 is thinner than the thickness W12, the nitrided portion 16b is positioned proximally to the silicon pillar 20, i.e., the channel surface, compared to the electrode film 17. In such a case, the distance between the cover silicon layer 20c and the portion of the nitrided portion 16b contacting the insulating portion 16a is shorter than the distance between the electrode film 17 and the cover silicon layer 20c. Also, as described above, the nitrided portion 16b and the protective film 50 are positioned between the blocking insulating film 23 so that the nitrided portion 16b and the protective film 50 do not overlap the electrode film 17 as viewed from the Z-direction.

A method for manufacturing the semiconductor memory device according to the first embodiment will now be described.

FIG. 7A and FIG. 7B to FIG. 11A and FIG. 11B are cross-sectional views showing the method for manufacturing the semiconductor memory device according to the first embodiment.

FIG. 7A to FIG. 11A show a cross section of a portion lower than the insulating film 13 in FIG. 3. FIG. 7B to FIG. 11B are enlarged views respectively showing region B of FIG. 7A to FIG. 11A.

Figure 7A:
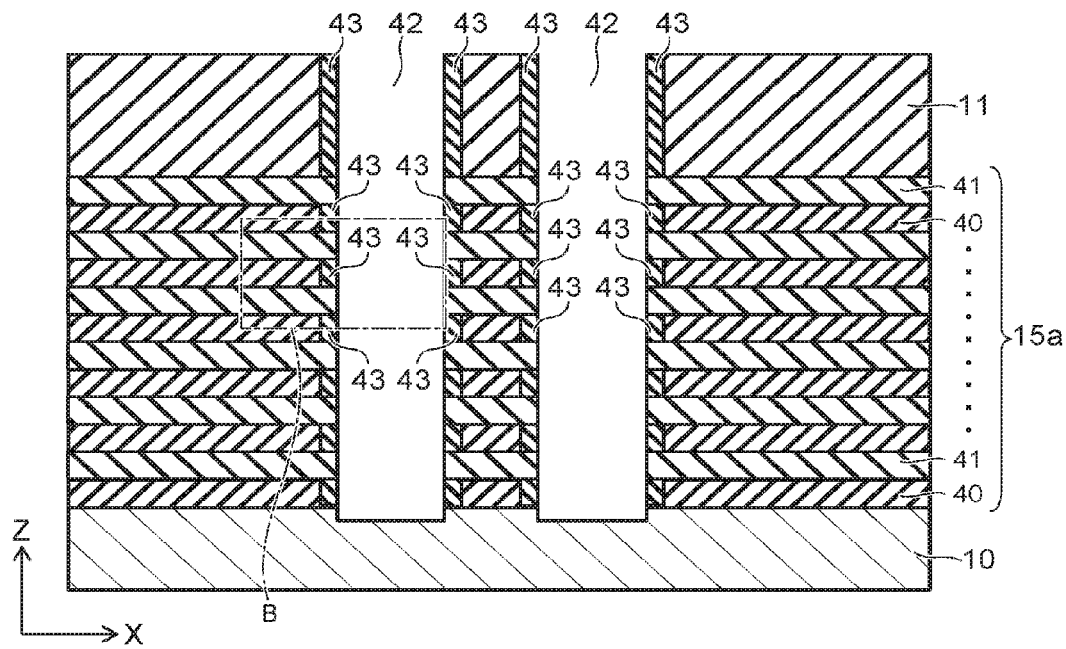
Figure 7B:
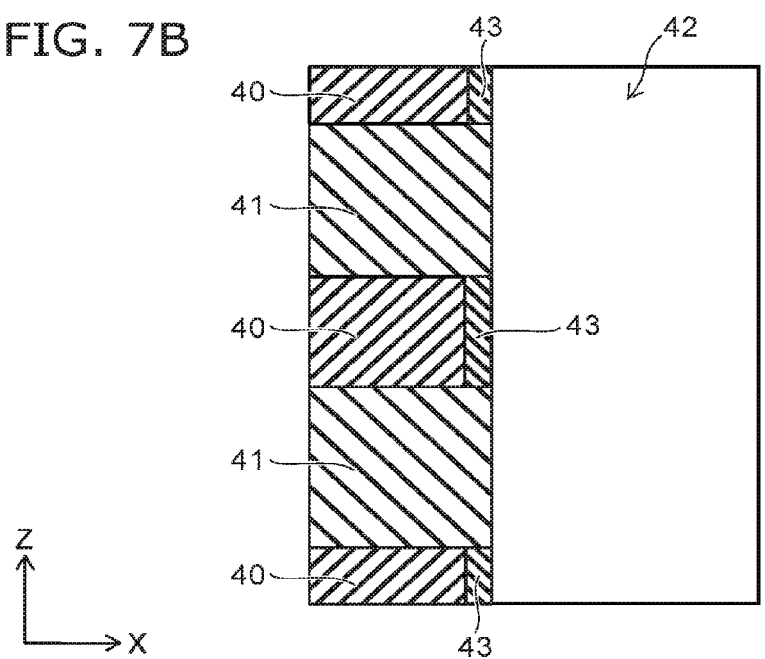

First, as shown in FIG. 7A and FIG. 7B, a stacked body 15a is formed by stacking an insulating film 40 and a sacrificial film 41 alternately along the Z-direction by, for example, CVD (Chemical Vapor Deposition) on the substrate 10. The insulating film 40 is formed of silicon oxide. The sacrificial film 41 is formed of a material having etching selectivity with the insulating film 40 and is formed of, for example, silicon nitride. The insulating film 11 is then formed on the stacked body 15a.

Subsequently, multiple memory holes 42 (through-holes) are made in the insulating film 11 and the stacked body 15a by, for example, RIE (Reactive Ion Etching). The memory holes 42 extend in the Z-direction, pierce the insulating film 11 and the stacked body 15a, and reach the substrate 10. The memory holes 42 having circular configurations are arranged in a staggered configuration as viewed from the Z-direction.

Next, plasma nitridation of the insulating film 40 is performed via the memory holes 42. Thereby, the surface of the insulating film 40 is nitrided; and a nitrided film 43 is formed. Further, the surface of the insulating film 11 also is nitrided; and the nitrided film 43 is formed. In the case where the insulating film 40 and the sacrificial film 41 are formed respectively of silicon oxide and silicon nitride, the silicon oxynitride film is formed by selectively nitriding the surface of a silicon oxide film. In such a case, the silicon oxynitride film is formed by plasma nitridation using nitrogen gas, or using nitrogen gas and hydrogen gas. The nitrided film 43 surrounds a portion of the side surface of the memory hole 42. Also, the side surface of the nitrided film 43 is surrounded with the insulating film 40.

The nitrided film 43 may be formed by performing radical nitridation of the insulating film 40. To stabilize the film structure of the nitrided film 43, annealing such as $N_2$ annealing, $O_2$ annealing, etc., may be performed after forming the nitrided film 43.

An insulating film that includes a material having a dielectric constant higher than that of the insulating film 40 may be formed in the insulating film 40 on the inner surface of the memory hole 42. In the case where the formation rate of the insulating film having the high dielectric constant formed in the sacrificial film 41 is lower than the formation rate of the insulating film having the high dielectric constant formed in the insulating film 40 on the memory hole 42 inner surface, the insulating film can be formed selectively in the insulating film 40. For example, in the case where the insulating film 40 and the sacrificial film 41 are formed respectively of silicon oxide and silicon nitride, the insulating film can be formed selectively on the silicon oxide film by utilizing the difference between the incubation time when forming the insulating film on the silicon oxide film and the incubation time when forming the insulating film on the silicon nitride film. Also, as another method, an insulating film that forms a stable silicate by reacting with the silicon oxide film may be deposited on the inner surface of the memory hole 42; and only the silicate formed on the insulating film 40 may be caused to selectively remain by removing the insulating film by wet etching, etc., after annealing is performed.

The insulating film that includes the material having the dielectric constant higher than that of the insulating film 40 can be formed in the insulating film 40 by using any of the methods described above.

Figure 8A:
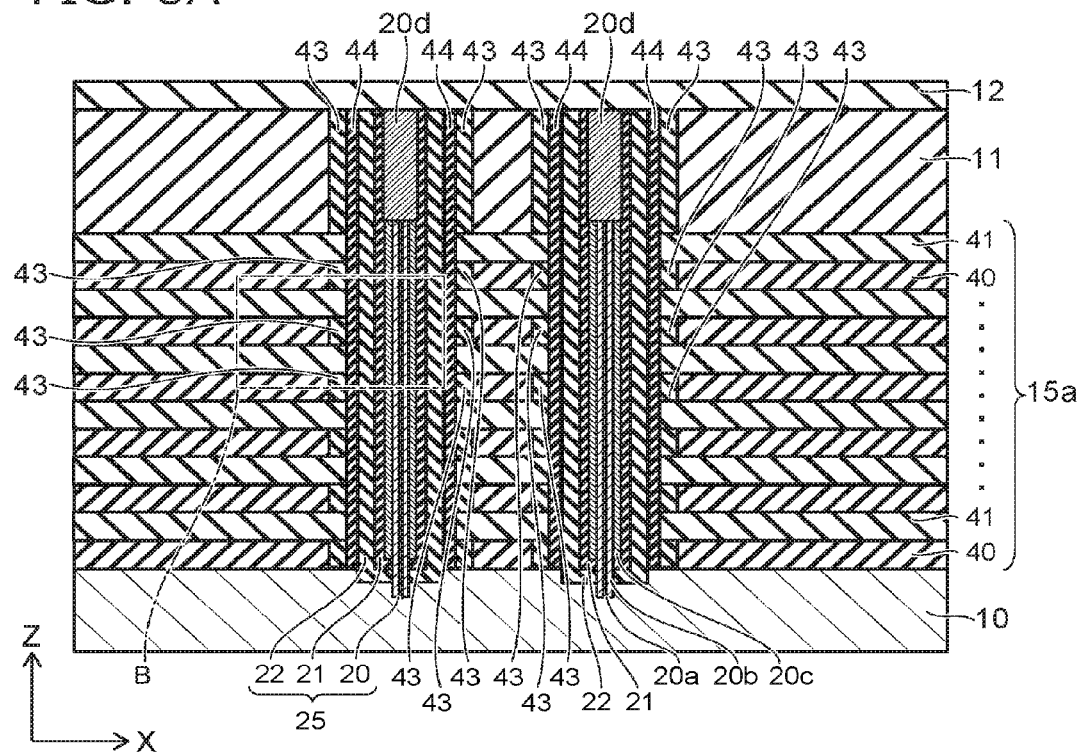
Figure 8B:
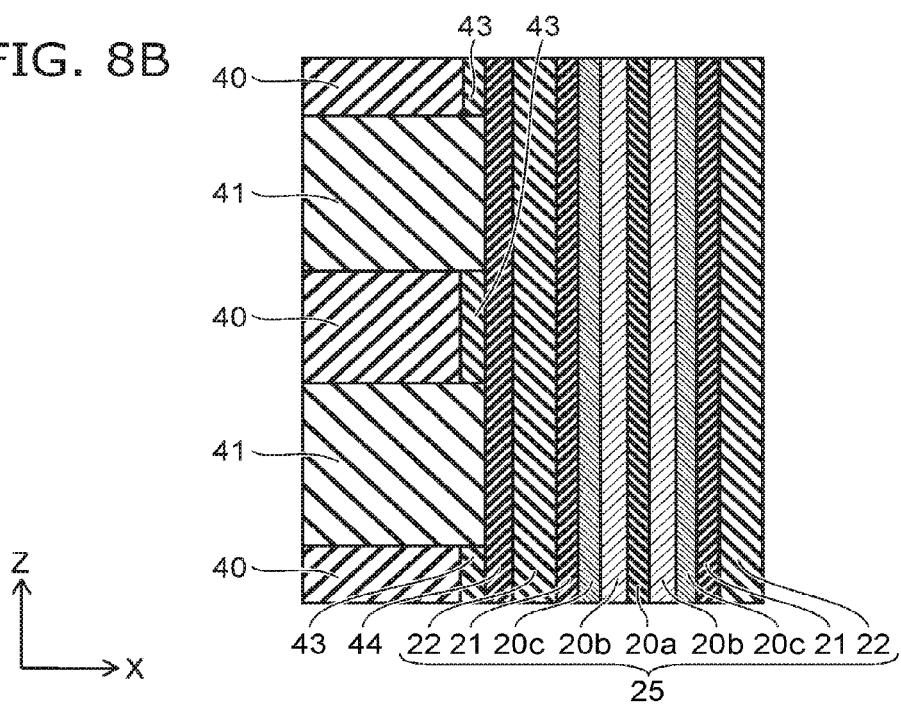

Then, as shown in FIG. 8A and FIG. 8B, an insulating film 44 is formed by depositing silicon oxide on the inner surface of the memory hole 42 by, for example, CVD. A portion of the insulating film 44 is surrounded with the nitrided film 43.

Subsequently, by, for example, CVD, the charge storage film 22 is formed by depositing silicon nitride on the insulating film 44; the tunneling insulating film 21 is formed by depositing silicon oxide; and the cover silicon layer 20c is formed by depositing silicon. Subsequently, by performing RIE, the substrate 10 is exposed by removing the cover silicon layer 20c, the tunneling insulating film 21, the charge storage film 22, and the insulating film 44 on the bottom surface of the memory hole 42.

Next, the silicon body unit 20b is formed by depositing silicon; and the insulating core unit 20a is formed by depositing silicon oxide. The silicon body unit 20b reaches the substrate 10 and contacts the substrate 10. Subsequently, the upper portions of the cover silicon layer 20c, the silicon body unit 20b, and the insulating core unit 20a are removed by performing etch-back; and the plug unit 20d is formed by filling silicon into which an impurity is introduced. Thereby, the silicon pillar 20 is formed inside the memory hole 42. Also, the columnar unit 25 that includes the silicon pillar 20, the tunneling insulating film 21, and the charge storage film 22 is formed. The insulating film 12 is then formed on the insulating film 11.

Figure 9A:
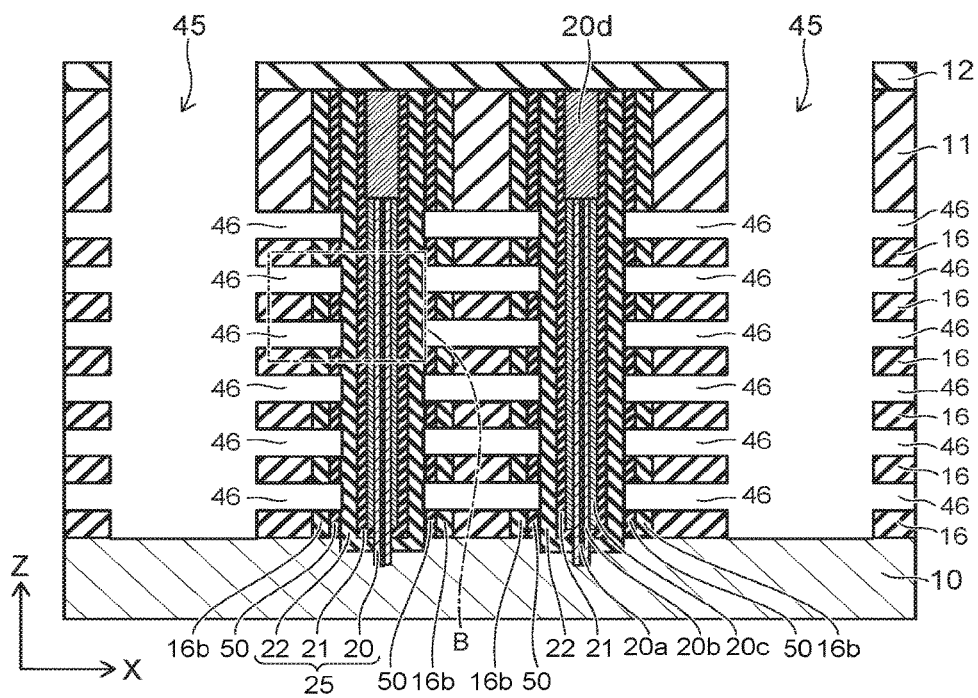
Figure 9B:
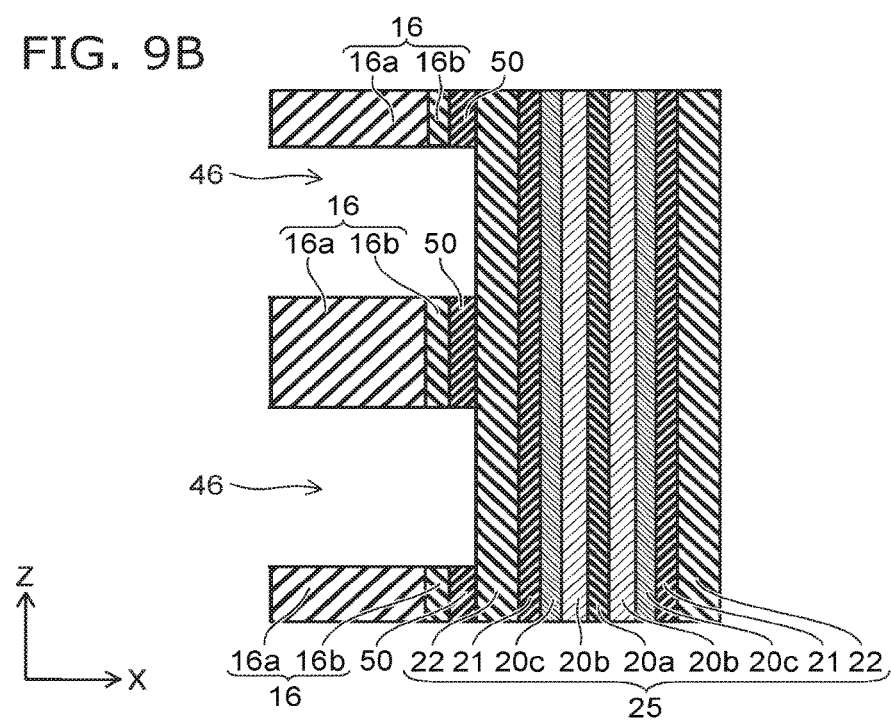

Then, as shown in FIG. 9A and FIG. 9B, for example, multiple slits 45 that extend in the Y-direction are made in the stacked body 15a by anisotropic etching such as RIE, etc. The slits 45 pierce the insulating film 12, the insulating film 11, and the stacked body 15a. The stacked body 15a is divided by the slits 45 into multiple stacked bodies extending in the Y-direction.

Subsequently, the sacrificial films 41 (referring to FIG. 8A) are removed by performing wet etching via the slits 45. For example, in the case where the sacrificial films 41 are formed of silicon nitride, phosphoric acid is used as the etchant of the wet etching; and the processing is performed using hot phosphoric acid. In the case where the nitrided film 43 is a silicon oxynitride film, the sacrificial films 41 are selectively removed without removing the nitrided film 43 due to the etching selectivity for hot phosphoric acid between silicon nitride and silicon oxynitride. Also, a gap 46 is made by removing the sacrificial films 41 via the slits 45.

Subsequently, the insulating film 44 that is exposed inside the gap 46 is removed by performing wet etching. For example, the etching is performed using dilute hydrofluoric acid as the etchant of the wet etching. In the case where the nitrided film 43 and the insulating film 44 respectively are a silicon oxynitride film and a silicon oxide film, the insulating film 44 is selectively removed without removing the nitrided film 43 due to the etching selectivity for dilute hydrofluoric acid between silicon nitride and silicon oxide. Also, a portion of the insulating film 40 is removed by the wet etching. Thereby, the insulating film 16 that includes the insulating portion 16a and the nitrided portion 16b is formed. Also, the protective film 50 is formed. The insulating film 40 and the nitrided film 43 correspond respectively to the insulating portion 16a and the nitrided portion 16b; and the insulating film 44 that is not removed corresponds to the protective film 50.

Figure 10A:
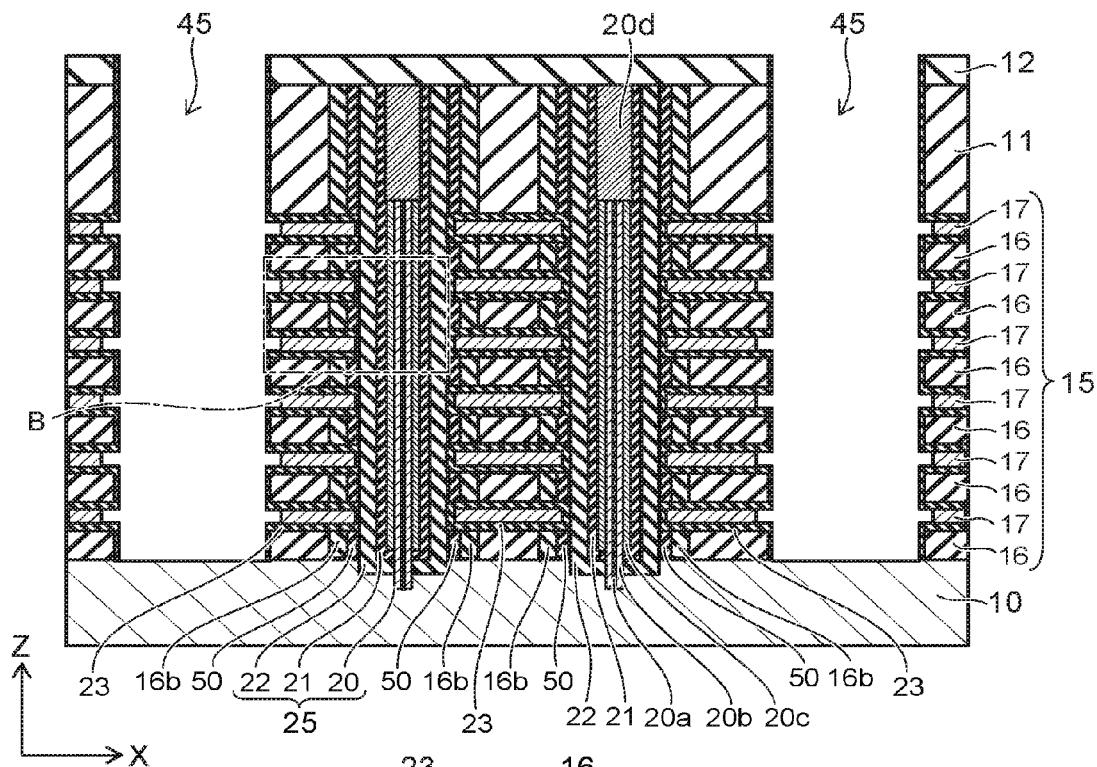
Figure 10B:
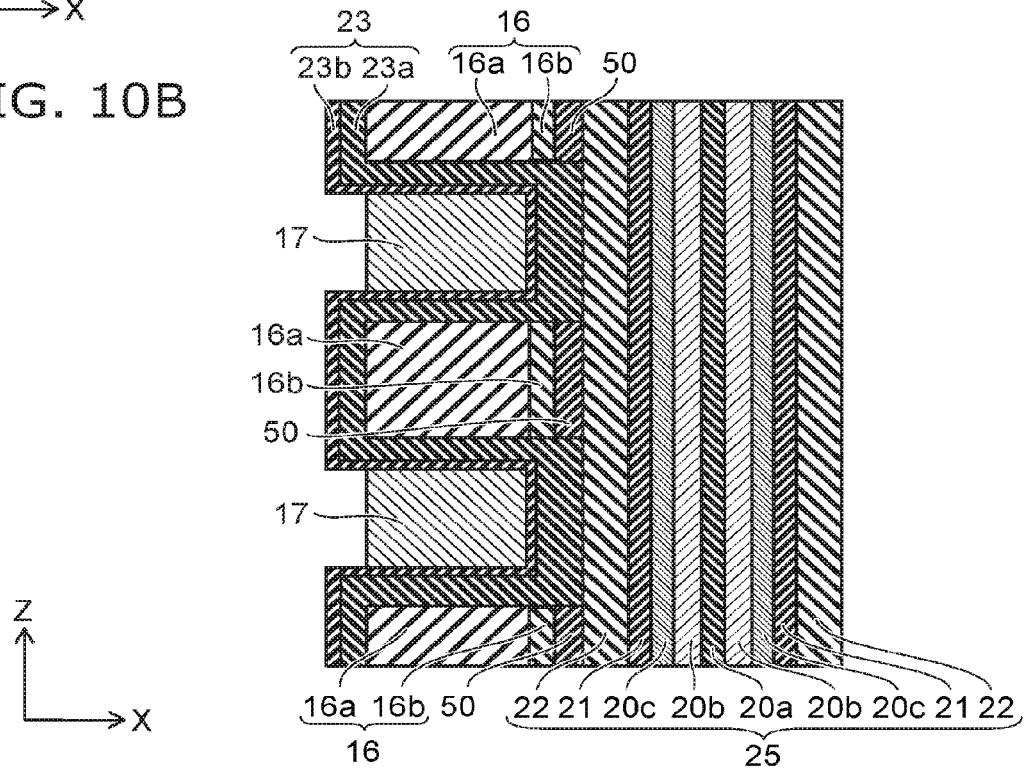

Then, as shown in FIG. 10A and FIG. 10B by, for example, CVD, the silicon oxide film 23a is formed by depositing silicon oxide on the side surface of the slit 45 and on the inner surface of the gap 46; and the aluminum oxide film 23b is formed on the silicon oxide film 23a. Thereby, the blocking insulating film 23 is formed. The blocking insulating film 23 is formed on the columnar unit 25 (the charge storage film 22) and the insulating film 16 in the X-direction. Also, the blocking insulating film 23 is formed on the insulating film 16 in the Z-direction.

Subsequently, a conductive film is formed on the entire surface by, for example, CVD. The conductive film is, for example, a tungsten film. The conductive film also enters the interior of the gap 46 via the slit 45. The conductive film is then etched and divided every gap 46 by CDE (Chemical Dry Etching) or isotropic etching such as wet etching, etc., so that the conductive films adjacent to each other in the Z-direction are not shorted. Thereby, the electrode films 17 are formed. Also, the stacked body 15 in which the insulating films 16 and the electrode films 17 are stacked alternately is formed. For example, the electrode films 17 are positioned between the blocking insulating film 23 so that the electrode films 17 do not overlap the nitrided portion 16b of the insulating film 16 as viewed from the Z-direction.

Figure 11A:
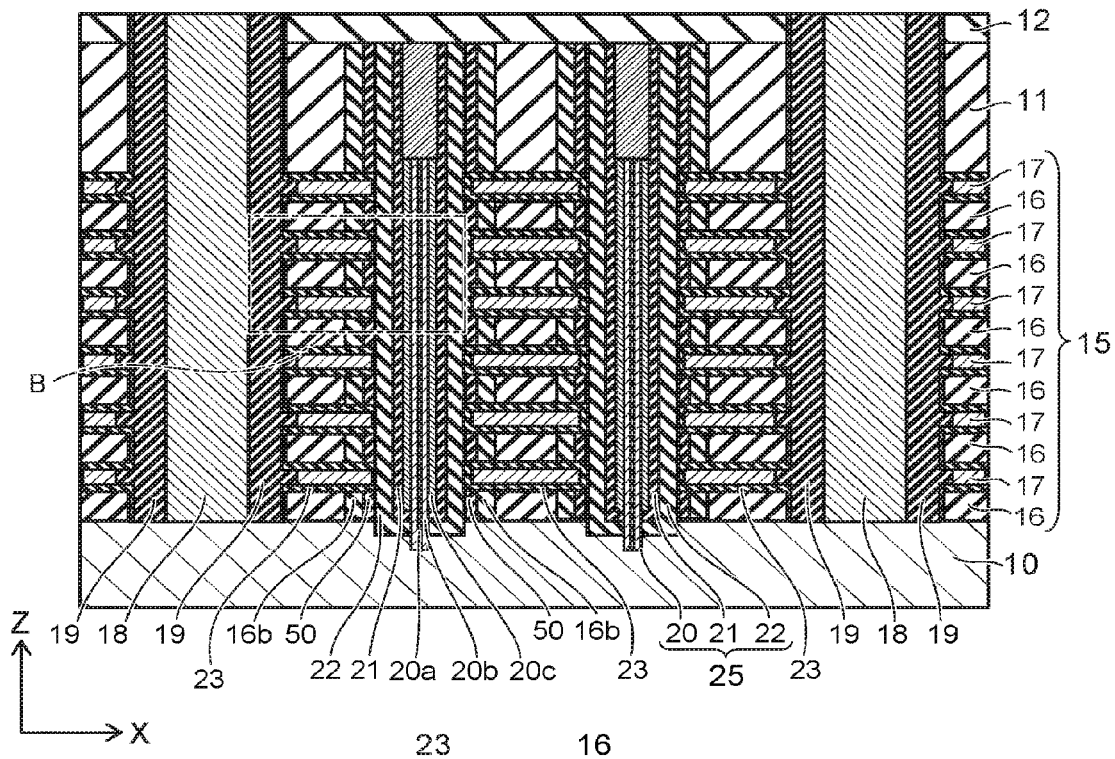
Figure 11B:
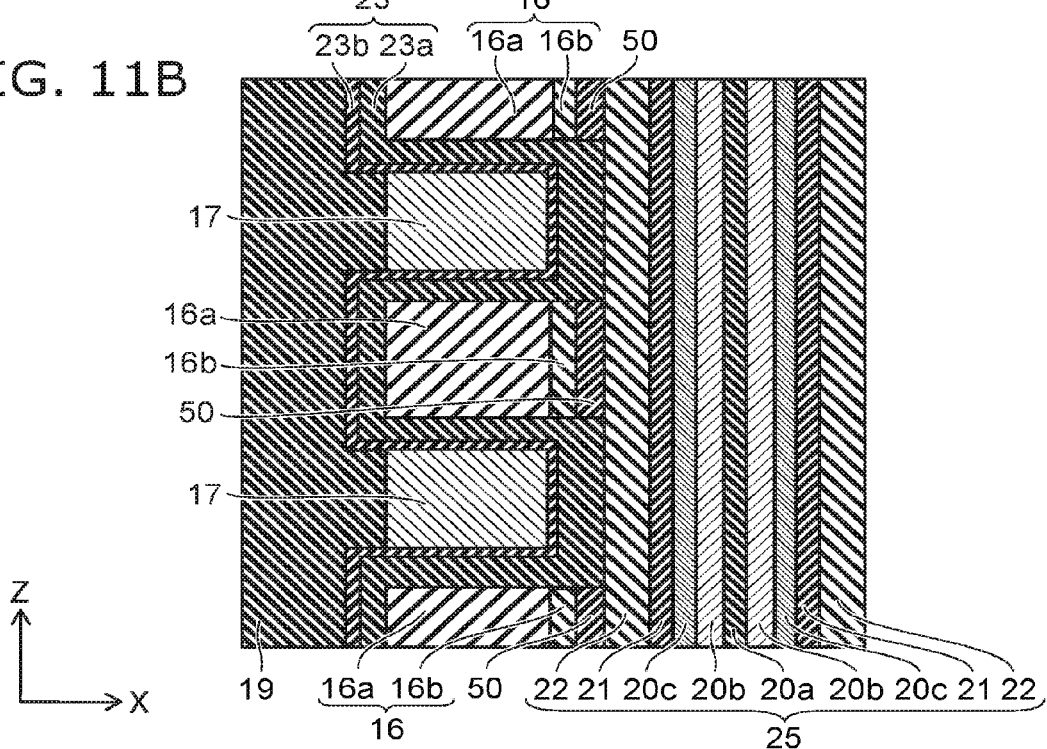

Then, as shown in FIG. 11A and FIG. 11B, the insulating film 19 is formed by forming an insulating film such as silicon oxide, etc., on the entire surface and by subsequently performing etch-back to cause the insulating film to remain on the side surface of the slit 45. The insulating film 19 is formed on the side surface of the slit 45 and inside the gap 46. The interconnect unit 18 is then formed inside the slit 45 by forming a conductive film by depositing tungsten, etc.

Subsequently, the insulating film 13 is formed on the insulating film 12; and the contact units 30 are formed by filling tungsten, etc., into contact holes piercing the insulating film 12 and the insulating film 13. The bit lines 31 are then formed on the insulating film 13. On the other hand, the source lines 33 that are connected to the contact units 32 are formed after forming the contact units 32 by filling the tungsten, etc., into the contact holes piercing the insulating film 13.

Thus, the semiconductor memory device 1 according to the first embodiment is manufactured.

Effects of the first embodiment will now be described.

As shown in FIG. 4 and FIG. 5, in the semiconductor memory device 1 according to the first embodiment, the insulating film 16 inside the stacked body 15 includes the insulating portion 16a including silicon oxide and the nitrided portion 16b including silicon oxynitride. Also, the insulating portion 16a surrounds the nitrided portion 16b; and the nitrided portion 16b is positioned on the columnar unit 25 side compared to the insulating portion 16a. Thereby, the nitrided portion 16b that has the dielectric constant higher than that of the insulating portion 16a is disposed in a region inside the insulating film 16 proximal to the silicon pillar 20 of the columnar unit 25. Also, the region where the nitrided portion 16b is disposed is a region that opposes the channel region between the memory cells, and is a region to which an electric field (a fringe electric field) is applied from the electrode film 17.

Here, by providing such a nitrided portion 16b in the insulating film 16, the lines of electric force from the electrode film 17 concentrate in the nitrided portion 16b because the lines of electric force from the electrode film 17 concentrate in regions having high dielectric constants. That is, the lines of electric force from the electrode film 17 concentrate in the region (the fringe region) where the fringe electric field is generated. Thereby, the electrical coupling between the electrode film 17 and the channel region becomes strong; the resistance of the silicon body unit 20b opposing the insulating film 16 becomes low; and the current flows easily. Because the current flows easily in the silicon pillar 20, for example, the current (the read-out current) flowing in the silicon pillar 20 becomes easy to sense in the read-out operation of the data. Also, the current that flows in the memory cell increases; and the erasing saturation is improved.

Also, it is desirable for the nitrided portion 16b of the insulating film 16 to be positioned between the blocking insulating film 23 so that the nitrided portion 16b does not overlap the electrode films 17 as viewed from the Z-direction. In such a case, the nitrided portion 16b is not positioned between the electrode films 17 adjacent to each other in the Z-direction and therefore does not affect the decrease of the breakdown voltage of the insulating film 16 (the insulating portion 16a) disposed between the electrode films 17. Thereby, the leakage current between the memory cells generated by the decrease of the breakdown voltage of the insulating film 16, etc., are suppressed.

According to the embodiment described above, a semiconductor memory device in which the occurrence of problems in the memory operations is suppressed can be realized.

A first modification of the first embodiment will now be described.

Figure 12:
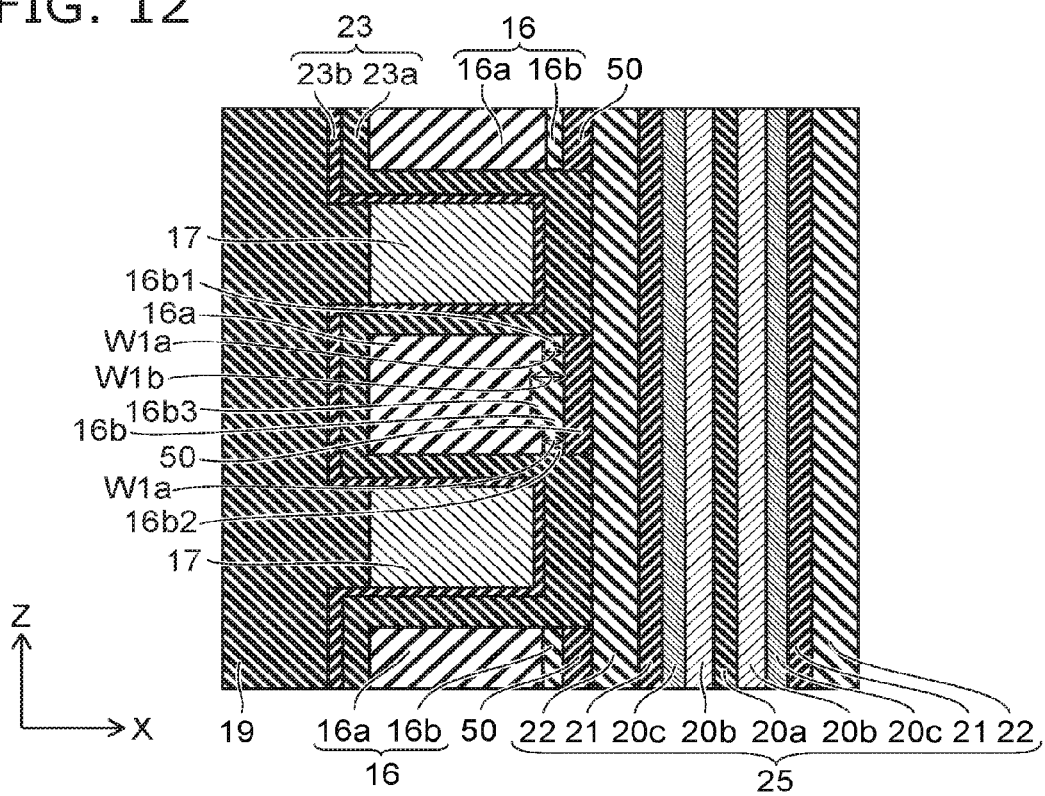
FIG. 12 and FIG. 13 are enlarged cross-sectional views showing a portion of a semiconductor memory device according to a modification of the first embodiment.

FIG. 12 is an enlarged cross-sectional view showing a portion of the semiconductor memory device 1; and the region illustrated by FIG. 12 corresponds to FIG. 5.

As shown in FIG. 12, the insulating portion 16a and the nitrided portion 16b are provided in the insulating film 16. A thickness W1a of an upper end 16b1 and a lower end 16b2 of the nitrided portion 16b is thinner than a thickness W1b of a middle 16b3. The middle 16b3 of the nitrided portion 16b is the portion positioned at equal distances in the Z-direction from the upper end 16b1 and the lower end 16b2.

The middle 16b3 of the nitrided portion 16b is separated from the electrode film 17 compared to the upper end 16b1 and the lower end 16b2. Considering that the lines of electric force from the electrode film 17 spread in the fringe region, the electrical coupling between the electrode film 17 and the channel region becomes weak at the middle 16b3. On the other hand, as in the embodiment, in the case where the thickness of the nitrided portion 16b at the middle 16b3 is set to be thick, compared to the case where the thickness of the nitrided portion 16b is set to be uniform, the lines of electric force from the electrode film 17 concentrate easily in the middle 16b3. Thereby, the current flows easily in the silicon body unit 20b opposing the insulating film 16 because the electrical coupling between the electrode film 17 and the channel region via the insulating film 16 at the middle 16b3 becomes strong.

A second modification of the first embodiment will now be described.

Figure 13:
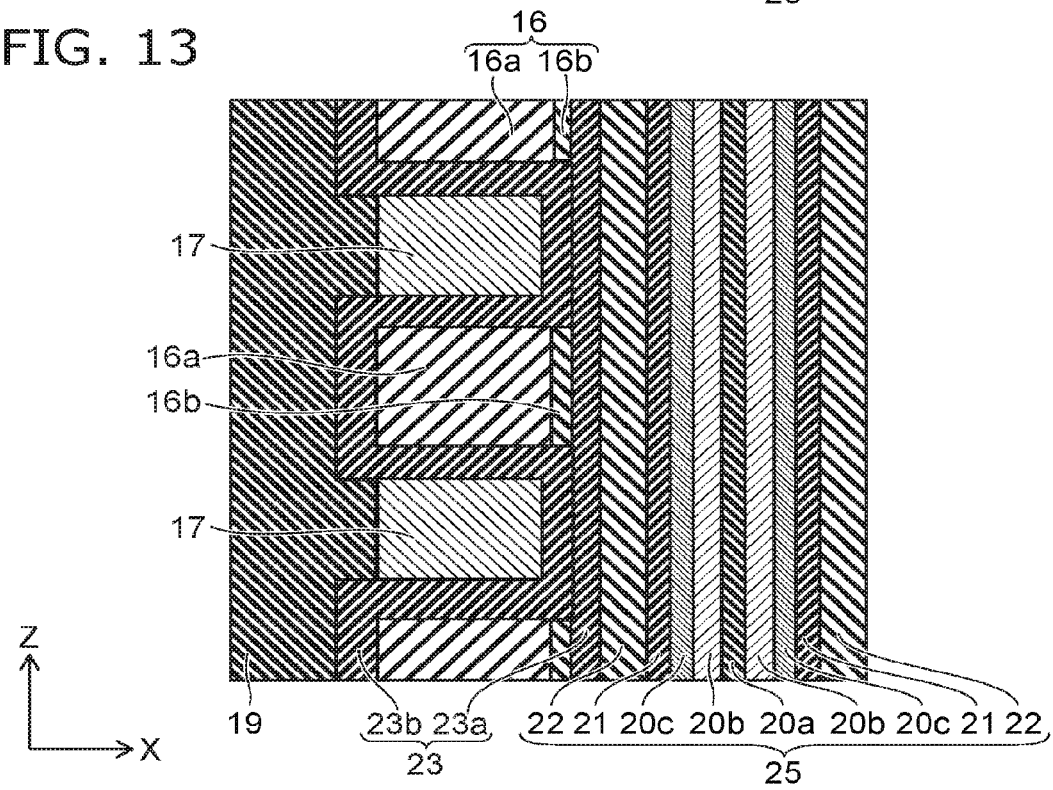

FIG. 13 is an enlarged cross-sectional view showing a portion of the semiconductor memory device 1; and the region shown in FIG. 13 corresponds to FIG. 5.

As shown in FIG. 13, the blocking insulating film 23 includes the silicon oxide film 23a and the aluminum oxide film 23b. The silicon oxide film 23a is provided around the charge storage film 22. The aluminum oxide film 23b is provided between the electrode film 17 and the silicon oxide film 23a. Also, the aluminum oxide film 23b is provided between the insulating film 16 and the electrode film 17 and between the insulating film 16 and the insulating film 19. By thus providing the blocking insulating film 23, the silicon oxide film 23a is formed instead of the protective film 50. Thereby, the process of forming the protective film 50, i.e., the process of forming the insulating film 44 of FIG. 8A and FIG. 8B, and the process of removing the insulating film 44 of FIG. 9A and FIG. 9B can be omitted.

(Second Embodiment)

Figure 14:
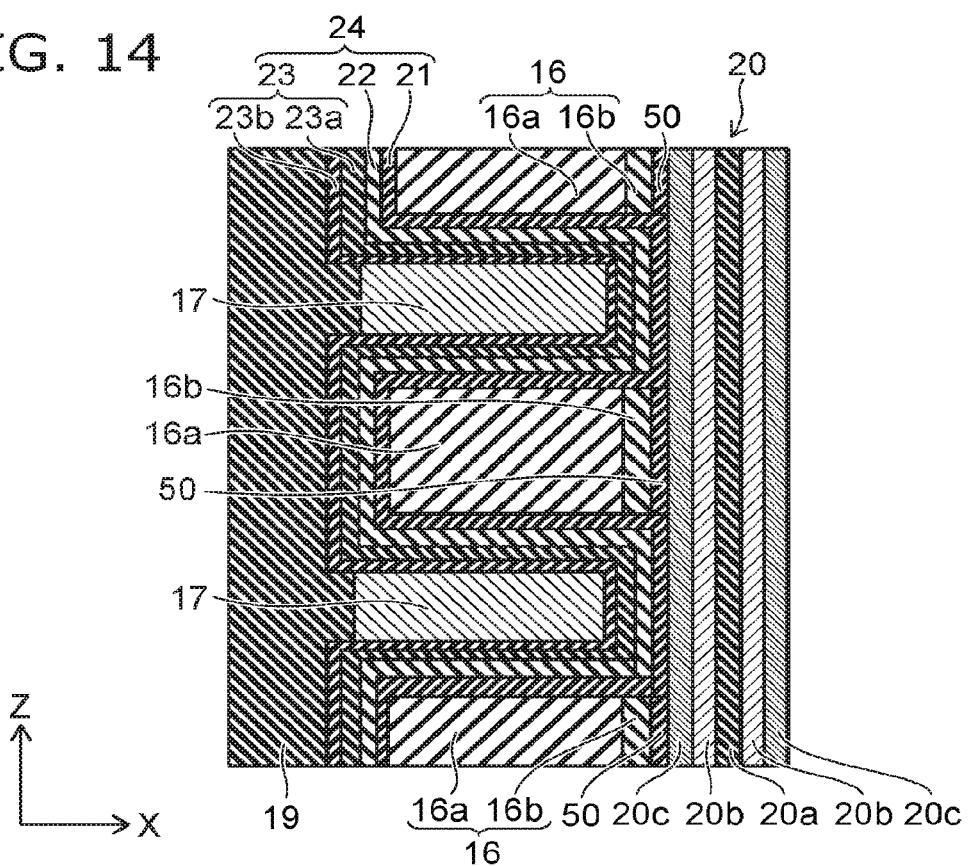
FIG. 14 and FIG. 15 are enlarged cross-sectional views showing a portion of a semiconductor memory device according to a second embodiment.
Figure 15:
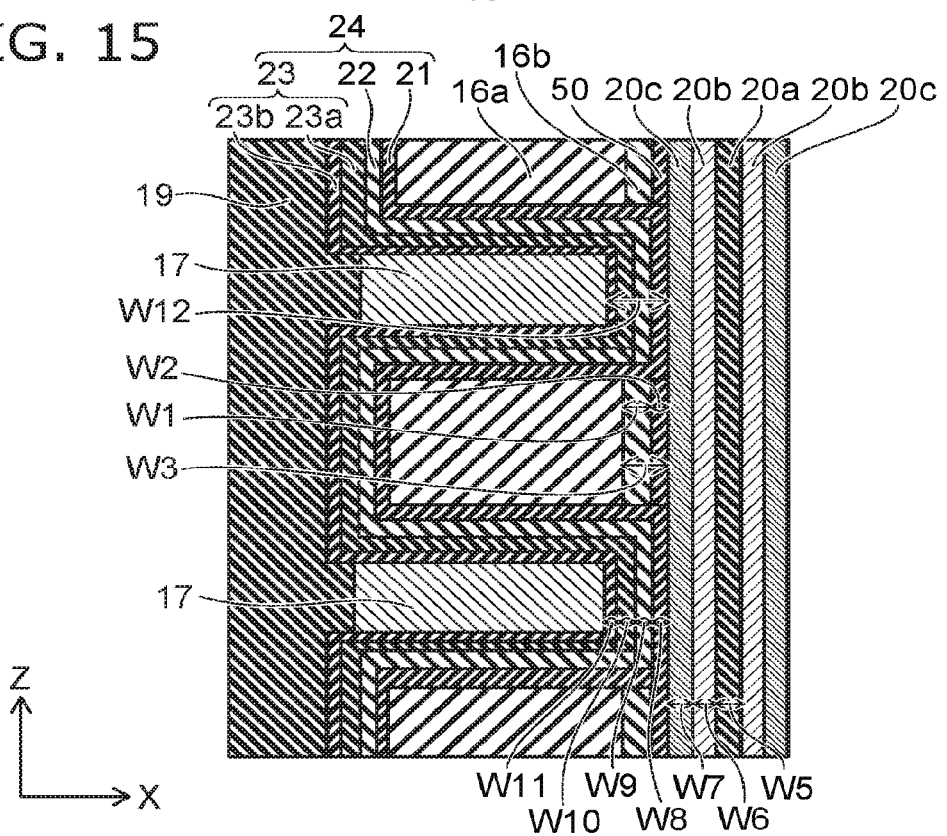

FIG. 14 and FIG. 15 are enlarged cross-sectional views showing a portion of a semiconductor memory device according to a second embodiment.

The cross sections of FIG. 14 and FIG. 15 correspond to the cross section of FIG. 5. Also, the arrangement of the memory film 24 is different between the second embodiment and the first embodiment. Other than the arrangement of the memory film 24, the other configurations are the same as those of the first embodiment, and a detailed description is therefore omitted.

As shown in FIG. 14, the silicon pillar 20 pierces the insulating film 11 and the stacked body 15 and extends in the Z-direction; and the lower end of the silicon pillar 20 contacts the substrate 10. The insulating core unit 20a, the silicon body unit 20b, the cover silicon layer 20c, and the plug unit 20d are provided in the silicon pillar 20.

The memory film 24 is provided to extend around onto the upper surface of the insulating film 16, onto the lower surface of the insulating film 16, and onto the side surface of the insulating film 16 on the insulating film 19 side. Although the memory film 24 is disposed between the electrode film 17 and the silicon pillar 20, the memory film 24 is not disposed between the insulating film 16 and the silicon pillar 20. That is, the memory film 24 is provided between the insulating film 16 and the electrode film 17, between the electrode film 17 and the cover silicon layer 20c, and between the insulating film 16 and the insulating film 19.

The insulating portion 16a is positioned between the tunneling insulating film 21 so that the insulating portion 16a is provided around the nitrided portion 16b. The nitrided portion 16b is positioned between the tunneling insulating film 21 so that the nitrided portion 16b is provided around the protective film 50. For example, the nitrided portion 16b does not overlap the electrode film 17 as viewed from the Z-direction. The protective film 50 is provided between the nitrided portion 16b and the silicon pillar 20 (the cover silicon layer 20c). Also, the protective film 50 is positioned between the tunneling insulating film 21 so that the protective film 50 is provided around the silicon pillar 20.

As shown in FIG. 15, for example, the thickness W1 of the nitrided portion 16b and the thickness W2 of the protective film 50 are thinner than the thickness W12 of the memory film 24 positioned between the electrode film 17 and the cover silicon layer 20c. For example, the total thickness W3 (W1+W2) of the nitrided portion 16b and the protective film 50 is thinner than the thickness W12. In such a case, the nitrided portion 16b and the protective film 50 do not overlap the electrode film 17 as viewed from the Z-direction. Also, the nitrided portion 16b and the protective film 50 are positioned to be interposed between the portion of the memory film 24 having the thickness W12 provided in contact with two electrode films 17 in the Z-direction. The thickness W12 of the memory film 24 is the total thickness of the thickness W8 of the tunneling insulating film 21, the thickness W9 of the charge storage film 22, the thickness W10 of the silicon oxide film 23a, and the thickness W11 of the aluminum oxide film 23b.

For example, in the case where the diameter of the memory hole is 120 nanometers, the thickness W1 and the thickness W2 are 2 nanometers. Also, the thickness W5 of the insulating core unit 20a, the thickness W6 of the silicon body unit 20b, and the thickness W7 of the cover silicon layer 20c respectively are 10 nanometers, 10 nanometers, and 5 nanometers. The thickness W8, the thickness W9, the thickness W10, and the thickness W11 respectively are 5 nanometers, 3 nanometers, 6 nanometers, and 3 nanometers.

The thickness W12 is 17 nanometers; and the thickness W3 is 4 nanometers. In the case where the thickness W3 is thinner than the thickness W12, the nitrided portion 16b is positioned to be proximal to the silicon pillar 20, i.e., the channel surface, compared to the electrode film 17. In such a case, the distance between the cover silicon layer 20c and the portion of the nitrided portion 16b contacting the insulating portion 16a is shorter than the distance between the electrode film 17 and the cover silicon layer 20c. Also, as described above, the nitrided portion 16b and the protective film 50 are positioned between the memory film 24 so that the nitrided portion 16b and the protective film 50 do not overlap the electrode film 17 as viewed from the Z-direction.

A method for manufacturing the semiconductor memory device according to the second embodiment will now be described.

FIG. 16 to FIG. 19 are cross-sectional views showing the method for manufacturing the semiconductor memory device according to the second embodiment.

The method for forming the memory film 24 of the method for manufacturing the semiconductor memory device of the second embodiment is different from that of the method for manufacturing the semiconductor memory device of the first embodiment. Thereby, the process shown in FIG. 7A and FIG. 7B is the same between the second embodiment and the first embodiment; and the corresponding drawing and description are therefore omitted. Also, FIG. 16 to FIG. 19 are drawings corresponding to region B of FIG. 8A to FIG. 11A.

First, the process shown in FIG. 7A and FIG. 7B is implemented.

Figure 16:
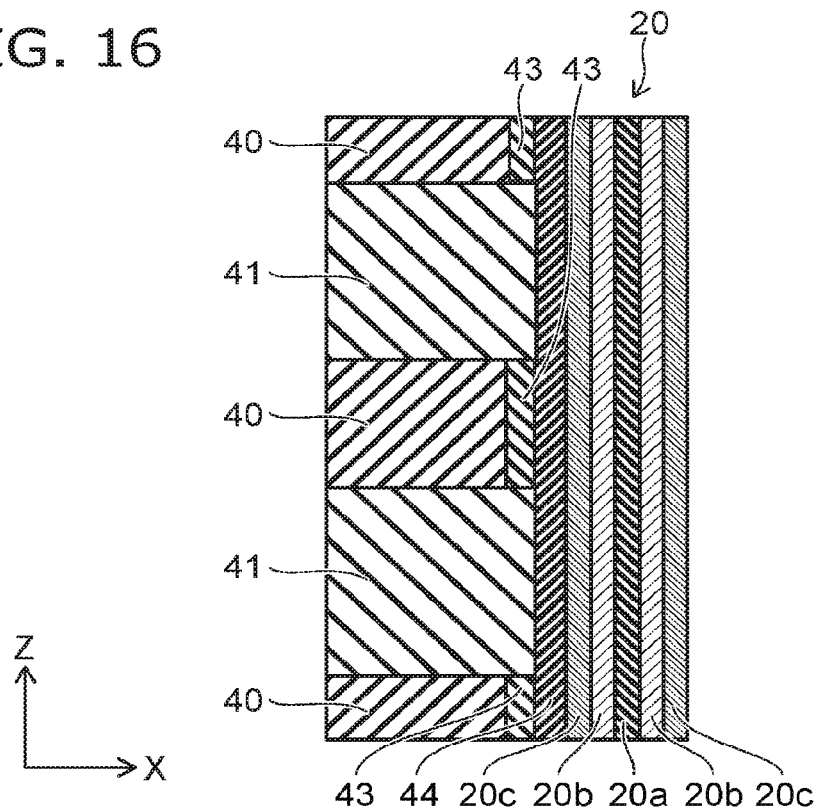
FIG. 16 to FIG. 19 are cross-sectional views showing a method for manufacturing the semiconductor memory device according to the second embodiment.

Then, as shown in FIG. 16, the insulating film 44 is formed by depositing silicon oxide on the inner surface of the memory hole 42. A portion of the insulating film 44 is surrounded with the nitrided film 43.

Subsequently, the cover silicon layer 20c is formed by depositing silicon on the insulating film 44 by, for example, CVD. The substrate 10 is then exposed by removing the cover silicon layer 20c and the insulating film 44 on the bottom surface of the memory hole 42 by performing RIE. Subsequently, the silicon body unit 20b is formed by depositing silicon; and the insulating core unit 20a is formed by depositing silicon oxide. The silicon pillar 20 is then formed inside the memory hole 42 by forming the plug unit 20d.

Figure 17:
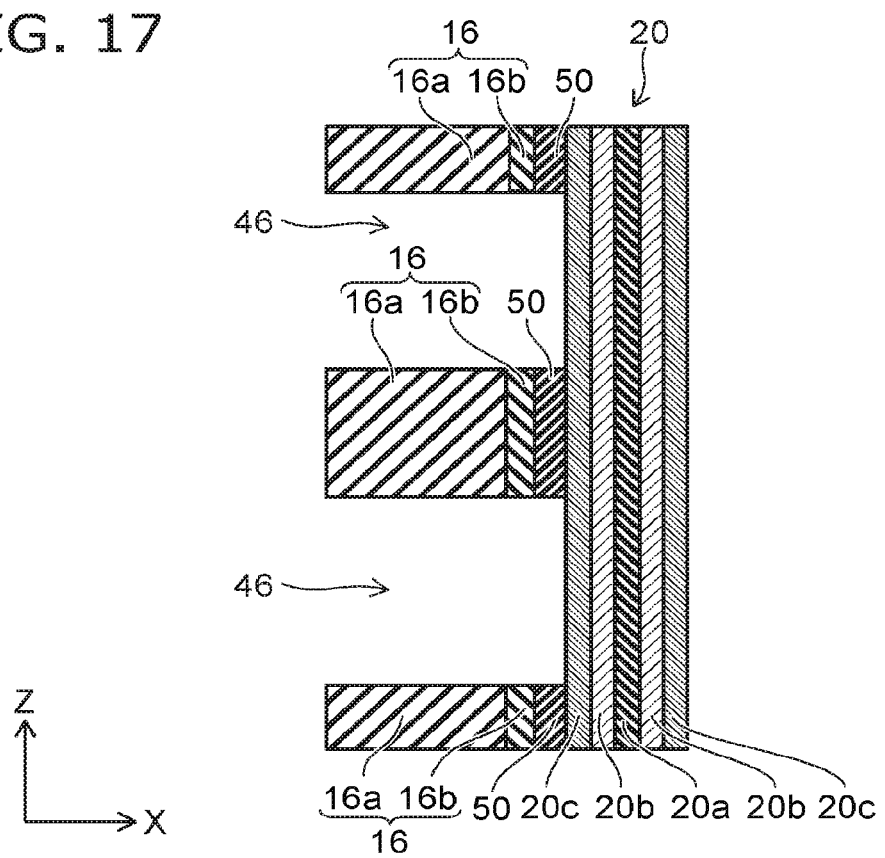

Then, as shown in FIG. 17, the sacrificial films 41 are removed by performing wet etching via the slit 45 made in the stacked body 15a. The gap 46 is made by removing the sacrificial films 41 via the slit 45.

Subsequently, the insulating film 44 that is exposed inside the gap 46 is removed by performing wet etching. Thereby, the insulating films 16 that include the insulating portion 16a and the nitrided portion 16b are formed.

Figure 18:
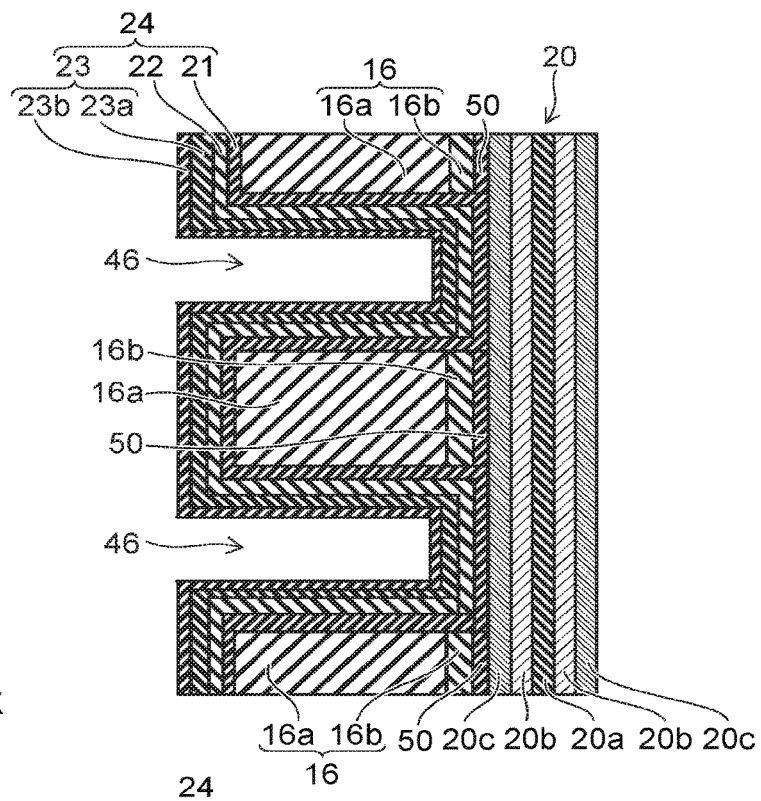

Then, as shown in FIG. 18 by, for example, CVD, the tunneling insulating film 21 is formed by depositing silicon oxide on the entire surface; and the charge storage film 22 is formed by depositing silicon nitride on the tunneling insulating film 21. Subsequently, the silicon oxide film 23a is formed on the charge storage film 22; and the aluminum oxide film 23b is formed on the silicon oxide film 23a. Thereby, the blocking insulating film 23 is formed. Also, the memory film 24 that includes the tunneling insulating film 21, the charge storage film 22, and the blocking insulating film 23 is formed. The memory film 24 is formed on the insulating film 16 and the silicon pillar 20 (the cover silicon layer 20c).

Figure 19:
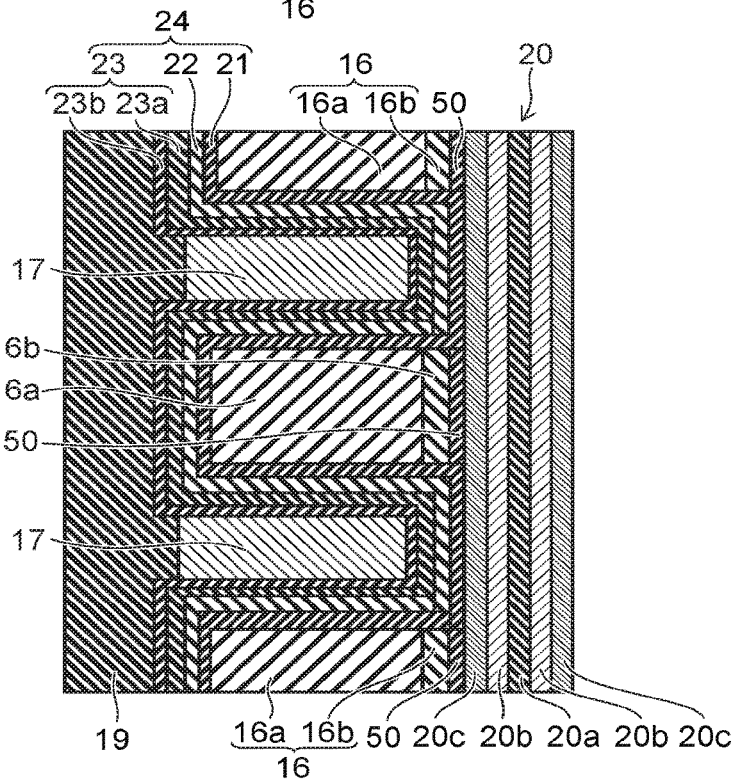

Then, as shown in FIG. 19, after a conductive film is formed on the entire surface, the conductive film is etched so that the conductive films adjacent to each other in the Z-direction are not shorted. Thereby, the electrode films 17 are formed. For example, the electrode film 17 is positioned between the memory film 24 so that the electrode film 17 does not overlap the nitrided portion 16b of the insulating film 16 as viewed from the Z-direction.

Subsequently, the insulating film 19 is formed inside the gap 46 and on the side surface of the slit 45. The interconnect unit 18 is then formed inside the slit 45.

Thus, the semiconductor memory device 1 according to the second embodiment is manufactured.

The effects of the second embodiment are similar to those of the first embodiment described above.

According to the embodiment described above, a semiconductor memory device in which the occurrence of problems in the memory operations is suppressed can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
   a substrate;
   a stacked body provided on the substrate, the stacked body including a plurality of first insulating films and a plurality of electrode films alternately stacked one layer by one layer;
   a semiconductor pillar provided inside the stacked body, the semiconductor pillar extending in a stacking direction of the stacked body; and
   a charge storage film provided between the semiconductor pillar and each of the electrode films,
   the plurality of first insulating films including a first portion and a second portion, the first portion surrounding the semiconductor pillar, the second portion being provided between the first portion and the semiconductor pillar and having a dielectric constant higher than a dielectric constant of the first portion, and
   as viewed from the stacking direction, one of the first insulating films and one of the electrode films adjacent in the stacking direction are arranged such that the second portion is interposed between the one of the electrode films and the charge storage film.

2. The semiconductor memory device according to claim 1, wherein
the first portion includes silicon oxide, and
the second portion includes silicon oxynitride.

3. The semiconductor memory device according to claim 1, wherein as viewed from a direction perpendicular to the stacking direction, the second portion overlaps the first portion and does not overlap the electrode film.

4. The semiconductor memory device according to claim 1, wherein a thickness of a middle of the second portion is thicker than thicknesses of an upper end and a lower end of the second portion.

5. The semiconductor memory device according to claim 1, wherein
the charge storage film extends in the stacking direction through the stacked body,
the second portion is provided between the first portion and the charge storage film and contacts the first portion,
the semiconductor pillar includes a body unit and a cover layer, the body unit including silicon and contacting the substrate, the cover layer being provided at a side surface of the body unit, and
in a direction perpendicular to the stacking direction, a distance between the cover layer and a portion of the second portion contacting the first portion being shorter than a distance between the cover layer and each of the electrode films.

6. The semiconductor memory device according to claim 1, further comprising a second insulating film provided between the charge storage film and each of the electrode films,
a thickness of the second portion in a direction perpendicular to the stacking direction being thinner than a thickness of the second insulating film in the direction perpendicular to the stacking direction.

7. The semiconductor memory device according to claim 1, wherein
the second portion contacts the first portion,
the semiconductor pillar includes a body unit and a cover layer, the body unit including silicon and contacting the substrate, the cover layer being provided at a side surface of the body unit, and
in a direction perpendicular to the stacking direction, a distance between the cover layer and a portion of the second portion contacting the first portion is shorter than a distance between the cover layer and each of the electrode films.

8. The semiconductor memory device according to claim 1, further comprising a protective film provided between the semiconductor pillar and the second portion, the protective film surrounding the semiconductor pillar,
a dielectric constant of the second portion being higher than a dielectric constant of the protective film.

9. The semiconductor memory device according to claim 8, wherein
the first portion and the protective film include silicon oxide, and
the second portion includes silicon oxynitride.

10. The semiconductor memory device according to claim 8, wherein the second portion and the protective film do not overlap the plurality of electrode films as viewed from the stacking direction.

11. The semiconductor memory device according to claim 8, further comprising a second insulating film provided between the charge storage film and each of the electrode films,
the total thickness of a thickness of the second portion and a thickness of the protective film in a direction perpendicular to the stacking direction being thinner than a thickness of the second insulating film in the direction perpendicular to the stacking direction.

12. The semiconductor memory device according to claim 8, further comprising:
a second insulating film provided between the charge storage film and each of the electrode films; and
a third insulating film provided between the semiconductor pillar and the charge storage film,
the total thickness of a thickness of the protective film and a thickness of the second portion in a direction perpendicular to the stacking direction being thinner than the total thickness of a thickness of the charge storage film, a thickness of the second insulating film, and a thickness of the third insulating film in the direction perpendicular to the stacking direction.

13. A semiconductor memory device, comprising:
a substrate;
a stacked body provided on the substrate, the stacked body including a plurality of first insulating films and a plurality of electrode films alternately stacked one layer by one layer;
a semiconductor pillar provided inside the stacked body, the semiconductor pillar extending in a stacking direction of the stacked body; and
a charge storage film provided between the semiconductor pillar and each of the electrode films,
the plurality of first insulating films including an insulating portion and a nitrided portion, the insulating portion surrounding the semiconductor pillar and including silicon oxide, the nitrided portion being provided between the insulating portion and the semiconductor pillar and including silicon oxynitride, and
one of the first insulating films and one of the electrode films adjacent in the stacking direction are arranged such that the nitrided portion is interposed between the one of the electrode films and the charge storage film.

14. The semiconductor memory device according to claim 13, wherein as viewed from a direction perpendicular to the stacking direction, the nitrided portion overlaps the insulating portion and does not overlap the electrode film.

15. The semiconductor memory device according to claim 13, wherein
the charge storage film extends in the stacking direction through the stacked body,
the nitrided portion is provided between the insulating portion and the charge storage film and contacts the insulating portion,
the semiconductor pillar includes a body unit and a cover layer, the body unit including silicon and contacting the substrate, the cover layer being provided at a side surface of the body unit, and
in a direction perpendicular to the stacking direction, a distance between the cover layer and a portion of the nitrided portion contacting the insulating portion is shorter than a distance between the cover layer and each of the electrode films.

16. The semiconductor memory device according to claim 13, wherein
the nitrided portion contacts the insulating portion,
the semiconductor pillar includes a body unit and a cover layer, the body unit including silicon and contacting the substrate, the cover layer being provided at a side surface of the body unit, and
in a direction perpendicular to the stacking direction, a distance between the cover layer and a portion of the nitrided portion contacting the insulating portion is shorter than a distance between the cover layer and each of the electrode films.

17. The semiconductor memory device according to claim 13, further comprising a protective film provided between the semiconductor pillar and the nitrided portion, the protective film surrounding the semiconductor pillar,
the protective film including silicon oxide,
the nitrided portion and the protective film not overlapping the plurality of electrode films as viewed from the stacking direction.

18. The semiconductor memory device according to claim 17, further comprising a second insulating film provided between the charge storage film and each of the electrode films,
the total thickness of a thickness of the nitrided portion and a thickness of the protective film in a direction perpendicular to the stacking direction being thinner than a thickness of the second insulating film in the direction perpendicular to the stacking direction.

19. A semiconductor memory device, comprising:
a substrate;
a semiconductor pillar extending in a first direction from the substrate;
a stacked body provided on the substrate, the stacked body including a plurality of first insulating films and a plurality of electrode films alternately stacked one layer by one layer in the first direction, each of the first insulating films and each of the electrode films extending so as to surround the semiconductor pillar in a second direction perpendicular to the first direction; and
a charge storage film provided between the semiconductor pillar and each of the electrode films,
the plurality of first insulating films including a first portion and a second portion, the first portion surrounding the semiconductor pillar, the second portion being provided between the first portion and the semiconductor pillar and having a dielectric constant higher than a dielectric constant of the first portion, and
as viewed from the second direction, the second portion overlapping the first portion and not overlapping the electrode film.

20. The semiconductor memory device according to claim 19, wherein
the first portion includes silicon oxide, and
the second portion includes silicon oxynitride.

* * * * *